United States Patent
Shindo et al.

(10) Patent No.: US 9,428,689 B2
(45) Date of Patent: Aug. 30, 2016

(54) LIGHT-EMITTING DEVICE AND ORGANIC-INORGANIC HYBRID PRE-POLYMER COMPOSITION COMPRISING PHOSPHOR

(71) Applicant: UBE MATERIAL INDUSTRIES, LTD., Ube-shi, Yamaguchi (JP)

(72) Inventors: Takuya Shindo, Hyogo (JP); Midori Sato, Hyogo (JP); Koichi Fukuda, Yamaguchi (JP); Kaoru Takazaki, Yamaguchi (JP); Jin Amagai, Yamaguchi (JP); Rika Nogita, Yamaguchi (JP); Toru Inagaki, Yamaguchi (JP); Kenji Arima, Yamaguchi (JP)

(73) Assignee: Ube Industries, Ltd., Yamaguchi (JP)

( * ) Notice: Subject to any disclaimer, the term of this patent is extended or adjusted under 35 U.S.C. 154(b) by 0 days.

(21) Appl. No.: 14/572,028

(22) Filed: Dec. 16, 2014

(65) Prior Publication Data

US 2015/0171288 A1 Jun. 18, 2015

(30) Foreign Application Priority Data

Dec. 17, 2013 (JP) .................................. 2013-260455

(51) Int. Cl.
*C09K 11/77* (2006.01)
*C09K 11/02* (2006.01)
*H01L 33/50* (2010.01)

(52) U.S. Cl.
CPC ............ *C09K 11/7734* (2013.01); *C09K 11/02* (2013.01); *H01L 33/501* (2013.01); *H01L 33/502* (2013.01)

(58) Field of Classification Search
CPC ... H01L 33/507; H01L 33/56; H01L 33/502; H01L 33/50; H01L 33/501; C09K 11/02; C09K 11/77
USPC .................................. 257/98, 99; 252/301.36
See application file for complete search history.

(56) References Cited

U.S. PATENT DOCUMENTS

| 2009/0045422 | A1* | 2/2009 | Kato ................... C09D 183/04 257/98 |
| 2013/0023686 | A1 | 1/2013 | Shindou et al. |
| 2013/0341671 | A1* | 12/2013 | Ona ....................... H01L 33/56 257/100 |

FOREIGN PATENT DOCUMENTS

| JP | 2010-248411 | 11/2010 |
| WO | WO 2010/090280 A1 | 8/2010 |
| WO | WO 2011/125832 A1 | 10/2011 |

* cited by examiner

*Primary Examiner* — Selim Ahmed
(74) *Attorney, Agent, or Firm* — Nixon Peabody LLP; Jeffrey L. Costellia

(57) ABSTRACT

A solid light-emitting device comprising a light-emitting semiconductor element and a phosphor dispersed in a sealant, in which the phosphor is exited by the light emitted by the semiconductor element to emit a visible light of a wavelength differing from that of the light emitted by the semiconductor element and is a silicate phosphor or a phosphor having a hydroxyl group on its surface, and the sealant is a condensation product of a prepolymer produced by condensation of polydimethyl-siloxane having a silanol group at both ends and an oligomer of an alkoxide of a metal or a semimetal or its derivative.

8 Claims, 2 Drawing Sheets

LIGHT-EMITTING DEVICE AND ORGANIC-INORGANIC HYBRID PRE-POLYMER COMPOSITION COMPRISING PHOSPHOR

FIELD OF THE INVENTION

The present invention relates to a solid light-emitting device comprising a light-emitting semiconductor element and a phosphor embedded in a sealant and further relates to a sealing composition containing a phosphor dispersed therein.

BACKGROUND OF THE INVENTION

The solid light-emitting device comprising a light-emitting semiconductor element such as a light emitting diode (LED) and a phosphor embedded in a sealant is well known and widely utilized, for example, as a back light of a liquid crystal display and an illumination device. In the solid light-emitting device, the semiconductor element emits a light by supply of electric energy and the phosphor is excited by the light emitted by the semiconductor element to emit a visible light of a wavelength differing from that of the light emitted by the semiconductor element. The light emitted by the semiconductor element generally is a ultraviolet or violet light having a wavelength of 350 to 430 nm. The phosphor may emit a blue light, a green light or a red light upon excitation with the light emitted by the semiconductor element. Also known is a white light-emitting device such as a white light-emitting LED device in which the white light is produced by mixing the blue light, green light and red light altogether.

In the solid light-emitting device, the phosphor is dispersed and embedded in a sealant to form a dispersed phosphor-containing sealant phase. The dispersed phosphor-containing sealant phase can be produced by placing a sealing composition comprising a curable sealing compound and a powdery phosphor over the semiconductor element unit and then curing the sealing compound.

As the sealing compound, a curable silicone resin is well known.

JP 2010-248411 A discloses a curable silicone resin containing an inorganic phosphor pre-treated with a hydroxyalkoxysliane or its oligomer and a light-emitting device in which a semiconductor element (LED chip) is sealed with a cured silicone resin composition containing the pre-treated inorganic phosphor. In this patent publication, it is described that phosphors showing low resistance to humid conditions, such as a sulfate phosphor and a silicate phosphor, are kept stable for a long period of time in a cured silicone resin sealant phase if the phosphors are pre-treated with a hydroxyalkoxysliane or its oligomer.

WO 2010/090280 A1 discloses a transparent sealant composition comprising a polysiloxane modified with an alkoxysilane and a curing catalyst, and a light-emitting semiconductor element sealed with the transparent sealant composition.

WO 2011/125832 A1 discloses an organic-inorganic hybrid prepolymer and a process for production thereof in which the organic-inorganic hybrid prepolymer is prepared by a condensation with hydrolysis of polydimethyl-siloxane having a silanol group on its one end or both ends and an oligomer of an alkoxide of metal and/or semi-metal or its derivative.

SUMMARY OF THE INVENTION

As is described in the above-mentioned JP 2010-248411 A, a silicate phosphor is less stable when it is kept under humid conditions, and JP 2010-248411 A proposes pre-treatment of the silicate phosphor with a hydroxyalkoxysliane or its oligomer to increase its resistance under such conditions that the silicate phosphor is sealed in a cured silicone resin composition in a light-emitting device and kept for a long period of time.

The present inventors have studied stability of a silicate phosphor sealed with a cured silicone composition in a solid light-emitting device and confirmed that a silicate phosphor shows poor stability when it is kept in a cured silicone sealant composition for a long period of time without the pre-treatment.

However, it is apparently disadvantageous to pre-treat a phosphor with a specific treating compound in advance of incorporation into a sealing composition, at least, from the viewpoint of manufacture of a solid light-emitting device in industry.

Therefore, the inventors have made further studies for the purpose of finding a sealant material to effectively seal a humidity sensitive phosphor such as a silicate phosphor, with no necessity of the pre-treatment. As a result, the inventors have fount that the humidity sensitive phosphor such as a silicate phosphor can be stably kept in a specific sealant material even if the phosphor is not pre-treated on its surface in advance of incorporation into the sealant material. The specific sealant material is a condensation product of a prepolymer produced by condensation of polydimethylsiloxane having a silanol group at both ends and an oligomer of an alkoxide of a metal or a semimetal, a hydrolysis product of the oligomer, a condensation product of the hydrolysis products, or a condensation product of the oligomer and the hydrolysis product.

The inventors have further found that not only the silicate phosphor but also a phosphor having a hydroxyl group on a surface thereof can be stably kept in the above-mentioned sealant material even if the phosphor is not pre-treated in advance of incorporation into the sealant material.

It is the inventors' understanding that the prepolymer of the above-mentioned sealant material is firmly attached to or reacts with the silicate phosphor or the phosphor having a hydroxyl group on a surface thereof, whereby keeping the sealed phosphor from contact with humid air.

Accordingly, there is provided by the invention a solid light-emitting device comprising a light-emitting semiconductor element and a phosphor dispersed in a sealant, said phosphor being exited by the light emitted by the semiconductor element to emit a visible light of a wavelength differing from that of the light emitted by the semiconductor element, in which the phosphor is a silicate phosphor or a phosphor having a hydroxyl group on a surface thereof,
and
in which the sealant is a condensation product of a prepolymer produced by condensation of polydimethylsiloxane having a silanol group at both ends and an oligomer of an alkoxide of a metal or a semimetal, a hydrolysis product of the oligomer, a condensation product of the hydrolysis products, or a condensation product of the oligomer and the hydrolysis product.

It is also provided by the invention a prepolymer composition containing a phosphor dispersed therein,
in which the phosphor is a silicate phosphor or a phosphor having a hydroxyl group on a surface thereof and
in which the sealant is a condensation product of a prepolymer produced by condensation of polydimethylsiloxane having a silanol group at both ends and an oligomer of an alkoxide of a metal or a semimetal, a hydrolysis product of the oligomer, a condensation product of the hydrolysis products, or a condensation product of the oligomer and the hydrolysis product.

PREFERRED EMBODIMENTS OF THE INVENTION

Figure 1:
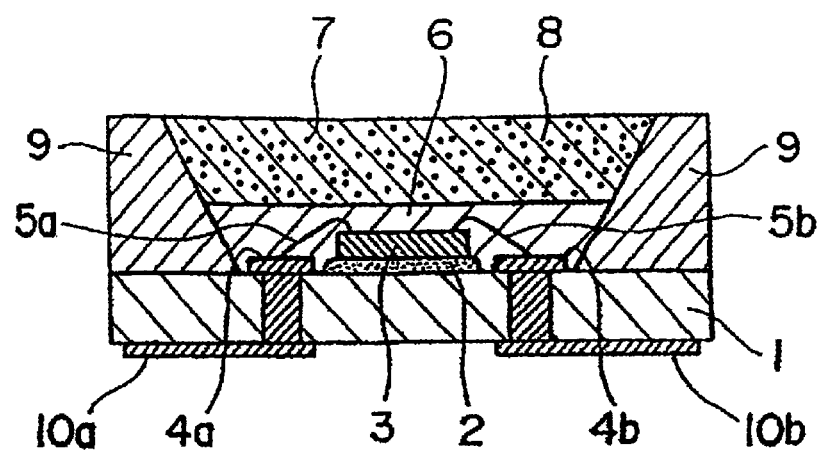
FIG. 1 is a sectional view of a solid light-emitting device embodying the present invention.

Preferred embodiments of the invention are described below.

(1) The solid light-emitting device in which the phosphor dispersed in a sealant is a silicate phosphor having a formula of $(Ba,Sr,Ca)_3MgSi_2O_8$ and being activated with Eu.

(2) The solid light-emitting device in which the oligomer of an alkoxide of a metal or a semimetal is a linear oligomer derived from 4-10 tetraalkoxysilane.

(3) The solid light-emitting device in which the polydimethylsiloxane has a number average molecular weight in the range of 10,000 to 100,000 and a ratio of Mw/Mn of 1.3 or less, wherein Mw means a weight average molecular weight and Mn means a number average molecular weight.

(4) The prepolymer composition in which the phosphor dispersed in a sealant is a silicate phosphor having a formula of $(Ba,Sr,Ca)MgSi_2O_8$ and being activated with Eu.

(5) The prepolymer composition in which the oligomer of an alkoxide of a metal or a semimetal is a linear oligomer derived from 4-10 tetraalkoxysilane.

(6) The prepolymer composition in which the polydimethylsiloxane has a number average molecular weight in the range of 10,000 to 100,000 and a ratio of Mw/Mn of 1.3 or less, wherein Mw means a weight average molecular weight and Mn means a number average molecular weight.

The above-mentioned invention is further described below.

The solid light-emitting device of the invention comprises a light-emitting semiconductor element and a phosphor dispersed in a sealant, in which the phosphor can be exited by the light emitted by the semiconductor element to emit a visible light of a wavelength differing from that of the light emitted by the semiconductor.

The light-emitting semiconductor element preferably emits a light having a wavelength in the range of 350 to 430 nm when it is activated by application of electric energy. A preferred example of the light-emitting semiconductor is AlGaN semiconductor element.

The phosphor dispersed in the sealant preferably emits a blue light, a green light or a red light when it is excited with the light emitted by the semiconductor. The phosphor can be a silicate phosphor activated with Eu or a phosphor having a hydroxyl group on its surface. Preferred examples of the silicate phosphors activated with Eu are described below:

a blue light-emitting phosphor of formula $(Ba,Sr,Ca)_3MgSi_2O_8:Eu^{2+}$;

a green light-emitting phosphor of formula $(Ba,Sr,Ca)_2SiO_4:Eu^{2+}$;

a red light-emitting phosphor of formula $(Ba,Sr,Ca)_3MgSi_2O_8:Eu^{2+},Mn^{2+}$.

The above-mentioned silicate phosphor can be activated further with a rare earth element such as Sc, Y, Gd, Tb or La.

In the phosphor having a hydroxyl group on its surface, the hydroxyl group can be attached locally or wholly onto the surface. It is known that the silicate phosphor has a hydroxyl group on its surface under such conditions that the hydroxyl group is combined with tetra-valent silicon atom on the phosphor surface. Examples of phosphors on which surface a hydroxyl group may exist include aluminate phosphors, tungstate phosphors, titanate phosphors, nitrde phosphors, and sulfide phosphors. Examples of these phosphors are described below:

blue light-emitting phosphors having formulas $(Ba, Sr, Ca)MgAl_{10}O_{17}: Eu^{2+}$ and $(Ba,Sr,Mg,Ca)_{10}(PO_4)_6(Cl,F)_2:Eu^{2+}$;

green light-emitting phosphors having formulas $BaMgAl_{10}O_{17}:Eu^{2+}$, $Mn^{2+}$, $\alpha$-SiAlON:$Eu^{2+}$, $\beta$-SiAlON:$Eu^{2+}$, $ZnS:Cu^{2+},Al^{3+}$; and red light emitting phosphors having formulas $Y_2O_2S:Eu^{2+}$, $La_2O_3S:Eu^{2+}$, $(Ca,Sr,Ba)_2Si_5N_8:Eu^{2+}$, $CaAlSiN_2:Eu^{2+}$, $Eu_2W_2O_9$, $(Ca,Sr,Ba)_2Si_5N_8:Eu^{2+},Mn$, $CaTiO_3:Pr^{3+},Bi^{2+}$, $(La,Eu)_2W_3O_{12}$.

The sealant in which the phosphor is dispersed can be a condensation product of a prepolymer (hereinafter referred to as "organic-inorganic hybrid prepolymer") produced by condensation of polydimethylsiloxane having a silanol group at both ends and an oligomer of an alkoxide of a metal or a semimetal, a hydrolysis product thereof, a condensation product of the hydrolysis products, or a condensation product of the oligomer and the hydrolysis product. The sealing phase can be produced by placing a sealing composition in which a phosphor is dispersed in the organic-inorganic hybrid prepolymer over a light-emitting semiconductor element and then curing the prepolymer in the sealing composition by heating. In the sealing composition, the phosphor is generally contained in an amount of 1 to 50 weight parts, preferably in an amount of 5 to 20 weight parts, per 100 weight parts of the prepolymer.

The organic-inorganic hybrid prepolymer, referred hereinafter to Compound (C), which is employed for the production of the sealant, can be produced by condensation of (A) polydimethylsiloxane having a silanol group at both ends and (B) an oligomer of an alkoxide of a metal or a semimetal, a hydrolysis product of the oligomer, a condensation product of the hydrolysis products, or a condensation product of the oligomer and the hydrolysis product.

<Compound (A)>

The polydimethylsiloxane (PDMS) having a silanol group at both ends, namely Compound (A), is described below in more detail.

Compound (A), namely, the polydimethylsiloxane having a silanol group at both end, can be represented by the following formula:

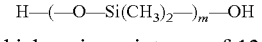

in which m is an integer of 135 to 1351.

Compound (A) can preferably have a number average molecular weight (Mn) in the range of 10,000 to 100,000, more preferably in the range of 15,000 to 40,000, most preferably, in the range of 20,000 to 40,000, so as to form a sealant material having a high softness, for instance, having a tensile elongation break of 150% or more, specifically 200% or more. The sealant material produced by the use of the above-mentioned Compound (A) shows high stability from an elevated temperature to a low temperature to keep the sealant phase from cracking. Moreover, the above-mentioned Compound (A) can be utilized without solvent so that troubles caused by the use of a solvent can be obviated.

In addition, Compound (A) preferably has a molecular weight distribution index (Mw/Mn) of 1.3 or less, more preferably 1.1 or less, so as to form a cured material showing a light transmittance at 300 nm of 95% or higher and a high heat resistance at temperatures of 200° C. or higher.

Compound (A) can be prepared by living-anion polymerization by the use of an alkyl lithium as a polymerization initiator.

The above-mentioned average molecular weights (Mw and Mn) are molecular weights expressed in terms of polystyrene-converted molecular weights and can be determined by gel permeation chromatography (GPC) under the below-described determination conditions.

a) Apparatus for measurement: SIC Autosampler Model 09 Sugai U-620 COLUMN HEATER Uniflows UF-3005S2B2 b) Detector: MILLIPORE Waters 410 Differential Refractometer c) Columns: Shodex KF806M (2 sets)

d) Oven temperature: 40° C.

e) Eluent: tetrahydrofuran (THF), 1.0 ml/min.

f) Reference sample: polystyrene g) Tested amount: 100 μL h) Concentration: 0.020 g/10 mL i) Preparation of sample: placed in THF containing 0.2 wt. % of 2,6-di-tert-butyl-p-phenol (BHT) and dissolved at room temperature by stirring.

j) Compensation: measured molecular weight is compensated by comparing the peaks of BHT at the time of preparation of a reference curve and the time of preparation of the sample.

<Compound (B)>

Compound (B) which gives an inorganic unit to the organic-inorganic hybrid prepolymer is one of the below mentioned compounds:

Compound (B-1): an oligomer of an alkoxide of a metal or a semimetal;

Compound (B-2); a hydrolysis product of the oligomer, namely Compound (B-1);

Compound (B-3): a condensation product of the hydrolysis products, namely Compounds (B-2);

Compound (B-4): a condensation product of the oligomer, namely Compound (B-1), and the hydrolysis product, namely Compound (B-2).

In Compound (B-1), the metal or semimetal can be Si or Ti. It is preferred that Compound (B-1) is an oligomer of silicon (Si) alkoxide, of which reaction can be easily controlled. More preferably is an oligomer of tetraalkoxysilane which can smoothly react with the terminal silanol groups attached to the polydimethylsiloxane.

Compound (B-1) can be represented by the following formula:

in which R is an alkyl group having carbon atoms of 1 to 3, such as methyl, ethyl, n-propyl or isopropyl, and n preferably is an integer of 4 to 10.

The oligomer preferably is a linear oligomer. The alkyl group preferably is ethyl from the viewpoint of reactivity and easiness of reaction control.

In the reaction with Compound (A), Compound (B-1) may be wholly or partially hydrolyzed to give its hydrolysis product, namely Compound (B-2). In addition, in the reaction with Compound (A), Compound (B-1) may be converted into a condensation product of Compound (B-1) and Compound (B-2), or a condensation product of two or more of Compound (B-2).

Compound (B-1), namely, an oligomer of an alkoxide of a metal or a semimetal, should be pure as high as possible, and preferably contains no monomer compound. If present, the monomer compound preferably is contained in an amount of not more than 10 wt. %, more preferably not more than 5 wt. %.

<Compound (C)>

As described hereinbefore, Compound (C), namely, the organic-inorganic hybrid prepolymer, can be produced by condensation of Compound (A), namely, polydimethylsiloxane having a silanol group at both ends and Compound (B), namely, an oligomer of an alkoxide of a metal or a semimetal, a hydrolysis product of the oligomer, a condensation product of the hydrolysis products, or a condensation product of the oligomer and the hydrolysis product.

The condensation of Compound (A) and Compound (B) can be performed in the presence of a condensation catalyst comprising an organic metal element, such as an organic tin compound (e.g., dibutyltin dilaurate or dibutyltin di-2-ethylhexanoate) or an organic titanium compound (e.g., titanium tetra-2-ethylhexoxide). In addition, an acid catalyst such as hydrochloric acid or an alkaline catalyst such as ammonia can be added for performing hydrolysis.

The above-mentioned condensation can be preferably carried out with or without hydrolysis of the oligomer (B-1) in a vessel filled with an inert gas by heating a mixture of the reaction compounds. The inert gas can be nitrogen gas or a gas of elements belonging to Periodical Table Group 18, such as helium, neon, argon, krypton, or xenon. These gases can be employed singly or in combination. For the hydrolysis, water or steam can be incorporated in the reaction mixture by dropping or spraying. It should be noted, however, that incorporation of an excessive amount of water may be disadvantageous for forming a uniform sealant phase.

The condensation reaction of Compound (A) and Compound (B) can be performed in the presence of an alcoholic solvent such as isopropyl alcohol or tert-butylalcohol so that the condensation can proceed smoothly or efficiently. Tert-butylalcohol is most preferred.

In the condensation with controlled hydrolysis of Compound (B), it is understood that a portion of the alkoxy group of the tetraalkoxysilane is converted into hydroxyl group (—OH), and subsequently the condensation between the resulting hydroxyl group and the silanol groups attached to both ends of Compound (A) proceeds with dehydration or dealcoholation.

In the condensation, Compound (A) and Compound (B-1) can be employed at a molar ratio of (A)/((B-1) in the range of 0.1 to 2, preferably in the range of 0.2 to 1, that is, 0.5 to 10 mols of Compound (B-1) per one mol of Compound (A), preferably 1 to 5 mols of Compound (B-1) per one mol of Compound (A).

The solid light-emitting device of the invention is further described in more detail referring to FIG. 1 and a white light-emitting device (namely, a white LED device) employing a blue light-emitting phosphor, a green light-emitting phosphor and a red light-emitting phosphor.

In FIG. 1, the solid light-emitting device (white LED device) comprises a substrate 1, a light-emitting semiconductor element 3 fixed to the substrate 1 by an adhesive 2, a pair of electrodes 4a, 4b formed on the substrate 1, a pair of lead wires 5a, 5b connecting the semiconductor element 3 to both of the electrodes 4a, 4b, a resin layer 6 covering the semiconductor element 3, a sealant composition layer 8 covering the resin layer 6, in which the sealant composition layer 8 comprises phosphors 7 and sealant, a light-reflecting material 9 surrounding the resin layer 6 and sealant composition layer 8, and electroconductive wires 10a, 10b connecting both of the electrodes 4a, 4b to a power source (not shown). The phosphors 7 comprise three phosphors, namely, a blue light-emitting phosphor, a green light-emitting phosphor and a red light-emitting phosphor.

The substrate 1 can be made of ceramic material such as glass, alumina or aluminum nitride or resin composition material comprising inorganic particles such as metal oxide particles or glass particles dispersed in a resin.

The resin layer 6 can be made of transparent resin such as epoxy resin or silicone resin. Otherwise, the resin layer 6 can be made of the organic-inorganic hybrid polymer. The resin layer 6 may be omitted.

The light-reflecting material 9 can be made of a resin composition in which white metal compound particles or a white pigment such as a metal (e.g., Al, Ni, Fe, Cr, Ti, Cu, Rh, Ag, Au or Pt), a metal compound (e.g., alumina, zirconia, titania, magnesia, zinc oxide, or calcium carbonate) is dispersed in a resin.

In the solid light-emitting device of FIG. 1, electric energy is supplied to the electrodes 4a, 4b via the electroconductive wires 10a, 10b, whereby the semiconductor element 3 is activated to emit a light having an emission peak in the wavelength region of 350 to 430 nm. This light excites the phosphors 7 in the sealant composition layer 8, to produce lights of blue color, green color and red color. These lights mix altogether to produce a white light.

The solid light-emitting device of FIG. 1 can be manufactured by the below-described steps:

On the substrate 1, a pair of electrodes 4a, 4b and a pair of electroconductive wires 10a, 10b are formed in the predetermined patterns. Subsequently, the semiconductor element 3 is fixed on the substrate 1 by the use of an adhesive 2. Then, a pair of the lead wires 5a, 5b are provided to electrically connect the semiconductor 3 to the electrodes 4a, 4b. Thereafter, the light-reflecting material 9 is placed around the semiconductor element 3, and the resin layer 6 is formed by placing a transparent resin over the semiconductor element 3 and curing the transparent resin. Over the resin layer 6 is placed a sealant composition layer by placing and curing the sealing composition comprising the phosphor and the organic-inorganic hybrid prepolymer.

The present invention is further described referring to the below-described working examples. In the working examples, "part(s)" and "%" are "weight part(s)" and "wt. %", respectively, unless otherwise indicated.

EXAMPLES

Synthesis Examples 1 to 3

Preparation of Organic-Inorganic Hybrid Prepolymer

The reaction vessel equipped with a stirrer, a thermometer and a dropping equipment was filled with nitrogen gas. Into the vessel filled with nitrogen gas, PDMS having a silanol group at both ends, a tetraalkylsilane oligomer, and a solvent were placed to give a reaction mixture, and the resulting mixture was stirred for 30 minutes at room temperature.

Subsequently, a condensation catalyst was added, and the resulting mixture was heated from room temperature to 140° C. at a temperature elevation rate of 10° C./min., and further heated at 140° C. for one hour. Afterward, the reaction mixture was left at room temperature to yield an organic-inorganic hybrid prepolymer in the form of sol. During the reaction, a nitrogen gas was supplied into the vessel.

In each synthesis example, details of the reactants and others are described below.

Synthesis Example 1

PDMS: Mn=23,000, Mw/Mn=1.10, amount: 85.0 g
oligomer: oligomer of 8 to 10 tetraalkylsilanes, oligomer purity: 95 wt. %, mean molecular weight: 1282, amount: 15.0 g
solvent: tert-butylalcohol, 150.0 g
condensation catalyst: dibutyltin dilaurate, 0.01 g.

Synthesis Example 2

PDMS: Mn=10,000, Mw/Mn=1.12, amount: 90.4 g
oligomer: oligomer of 4 to 6 tetraalkylsilanes, oligomer purity: 70 wt. %, mean molecular weight: 745, amount: 9.6 g
solvent: tert-butylalcohol, 96.0 g
condensation catalyst: dibutyltin dilaurate, 0.02 g.

Synthesis Example 3

PDMS: Mn=32,000, Mw/Mn=1.63, amount: 82.7 g
oligomer: oligomer of 8 to 10 tetraalkylsilanes, oligomer purity: 95 wt. %, mean molecular weight: 1282, amount: 17.3 g
solvent: tert-butylalcohol, 173.0 g
condensation catalyst: dibutyltin dilaurate, 0.01 g.

[Preparation of Catalyst Solution]

In a different vessel, PDMS, a catalyst, and a solvent were placed and heated to 60° C. for 30 minutes under stirring in an atmospheric condition, to yield a catalyst solution.

By this procedure, catalyst solutions 1 to 3 were prepared. Other reaction conditions are set forth below.

(Catalyst Solution 1) PDMS: Same as that employed in the synthesis example 1, 27.2 g
catalyst: zinc octylate 1.24 g and zirconium octylate 1.55 g
solvent: tert-butyl alcohol 3.0 g
(Catalyst Solution 2)
PDMS: Same as that employed in the synthesis example 2, 24.9 g
catalyst: zinc octylate 2.26 g and zirconium octylate 2.84 g
solvent: tert-butyl alcohol 3.0 g
(Catalyst Solution 3)
PDMS: Same as that employed in the synthesis example 3, 17.7 g
catalyst: zinc octylate 1.00 g and zirconium octylate 1.26 g
solvent: tert-butyl alcohol 2.0 g

[Preparation of Mixture of Organic-Inorganic Hybrid Prepolymer and Condensation Catalyst]

Mixture 1 was prepared from the organic-inorganic hybrid prepolymer prepared in synthesis example 1 and the catalyst solution 1 at a weight ratio of 100 to 10.

Mixture 2 was prepared from the organic-inorganic hybrid prepolymer prepared in synthesis example 2 and the catalyst solution 2 at a weight ratio of 100 to 10.

Mixture 3 was prepared from the organic-inorganic hybrid prepolymer prepared in synthesis example 3 and the catalyst solution 3 at a weight ratio of 100 to 15.

[Evaluation of Polymer Produced from Mixture of Organic-Inorganic Hybrid Prepolymer and Condensation Catalyst]

(Preparation of Specimen for Determination of Transparency)

The mixture was placed between a pair of quartz plate to give a layer of 0.5 mm thick and cured by heating 180° C. for 5 hours, to form a specimen comprising the pair of quartz plate and the cured polymer layer.

For comparison, a curable silicone resin (two components type, available from Momentive Corp., IVSM-4500) was placed between a pair of the same quartz plates, to give a layer of 0.5 mm thick and cured by heating 150° C. for 1 hour, to form a comparison specimen comprising the pair of quartz plate and the cured silicone resin layer.

(Measurement of Transparency)

The sample was subjected to measurement of transparency in a wavelength region of 300 nm to 800 nm using a spectrophotometer (U-4100 available from Hitachi, Ltd.). The results are graphically shown in FIG. 2, in which the curves i) to iii) are for the organic-inorganic hybrid polymers prepared from the organic-inorganic hybrid prepolymers of Synthesis examples 1 to 3, respectively, and the curve iv) is for the conventional silicone resin.

Figure 2:
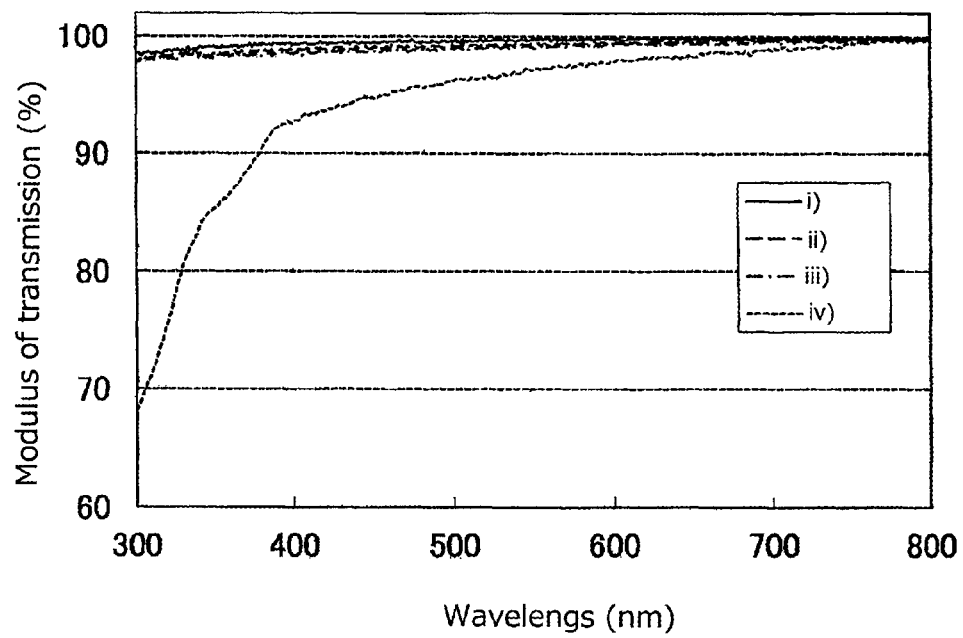
FIG. 2 graphically shows spectral transmittance of each of the organic-inorganic hybrid polymers prepared in Synthesis examples 1 to 3 and a conventional silicone polymer.

(Evaluation of the Measured Transparency) From FIG. 2, the organic-inorganic hybrid polymers prepared from the organic-inorganic hybrid prepolymers 1 to 3 show higher transparency in comparison with the conventional silicone resin. In more detail, the organic-inorganic hybrid polymers all show a transparency of 97% or higher at 300 nm, while the conventional silicone resin shows a transparency of 68% at 300 nm.

(Evaluation of Weight Decrease)

The mixture was placed in a PFA-coated mold (15 cm×15 cm) to give a molded product having a thickness of 4 mm, heated from room temperature to 250° C. for 10 hours. Subsequently, the product was further heated at 250° C. for 2 hours so as to complete the calcination, and recovered from the mold to give a square specimen (150 mm×150 mm×4 mm).

The specimen was weighed to check its initial weight and placed in a oven of convection air flow type and heated at 250° C. for 1,000 hours. After this heat treatment, the specimen was weighed to determine the weight loss.

By this determination, it was confirmed that the weight loss was 8%, 10% and 13% for the specimens obtained from the organic-inorganic hybrid prepolymers of Synthesis examples 1, 2, and 3, respectively.

Example

Evaluation of Organic-Inorganic Hybrid Polymer Containing Phosphor in Solid Light-Emitting Device (1) 100 weight parts of the organic-inorganic hybrid prepolymer prepared in Synthesis example 2 and 15 weight parts of a silicate phosphor ($Sr_3MgSi_2O_8:Eu^{2+}$) were mixed, to give 115 weight parts of a silicate phosphor-containing organic-inorganic hybrid prepolymer composition.

(2) On a silicate glass substrate having electrodes on its surface, a ultraviolet rays-emitting semiconductor element (emission wavelength: 400 nm) was fixed by the use of an adhesive. Thereafter, a light-reflecting material was placed on the substrate around the semiconductor element. The electrodes and semiconductor element were electrically connected by wire bonding.

Subsequently, a mixture of the silicate phosphor-containing organic-inorganic hybrid prepolymer composition (115 weight parts) and the aforementioned catalyst solution 2 (10 weight parts) was placed over the semiconductor element, and heated at 180° C. for one hour, whereby the prepolymer composition was cured. Thus, a solid blue light-emitting device comprising a light-emitting semiconductor element and a phosphor-containing sealant composition layer was manufactured.

(3) The solid blue light-emitting device was placed in a thermostat adjusted to 100° C., 40% RH. In the thermostat, a current of 300 mA was supplied to the semiconductor element to activate the semiconductor element. As a result, the blue light-emitting phosphor began to emit a blue light. The emission intensity of the emitted blue light was continuously checked to calculate the emission intensity retention with the passage of time. The emission intensity retention was calculated by the following formula:

$$\text{Emission intensity retention}(\%) = (B/A) \times 100$$

in which A is the initial emission intensity and B is an emission intensity after heating for a predetermined time.

Figure 3:
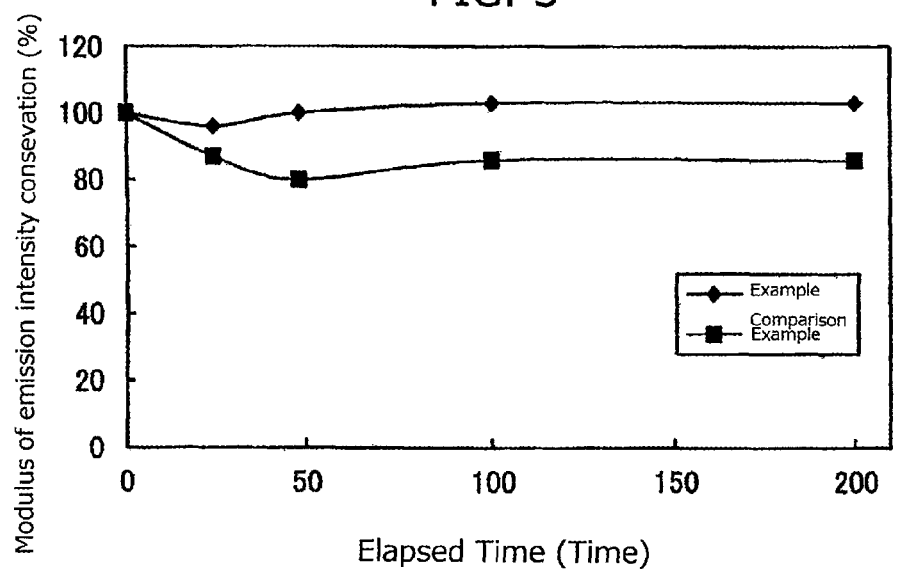
FIG. 3 graphically shows variation of emission intensity retention of each of the solid light-emitting devices manufactured in Example (which embodies the invention) and Comparison example.

The calculated emission intensity retention is graphically shown in FIG. 3.

Comparison Example

Evaluation of Conventional Silicone Resin Containing Phosphor in Solid Light-Emitting Device 100 weight parts of a commercially available silicone resin (KER 2600, available from Shin-etsu Chemical Industries, Ltd.) were mixed with 15 weight parts of the silicate phosphor ($Sr_3MgSi_2O_8:Eu^{2+}$) to prepare a phosphor-containing curable silicone resin composition.

The procedures described in Example were repeated except for replacing the silicate phosphor-containing organic-inorganic hybrid prepolymer composition with the thus prepared phosphor-containing curable silicone resin composition and heating at 150° C. for 4 hours, to manufacture a solid blue light-emitting device comprising a light-emitting semiconductor element and a phosphor-containing sealant composition layer.

Emission intensity retention of the thus manufactured solid blue light-emitting device was checked and calculated in the same manner, and the calculated emission intensity retention is graphically shown also in FIG. 3.

[Comparison of Emission Intensity Retention Between the Light-Emitting Device of Example and that of Comparison Example]

FIG. 3 clearly indicates that the emission intensity retention of the light-emitting device of Example (in which the organic-inorganic prepolymer was employed for sealing the silicate phosphor) is kept higher, as compared with that of the light-emitting device of Comparison example (in which the conventional curable silicone resin was employed for sealing the silicate phosphor). In more detail, the initial emission intensity was substantially kept even after heating for 200 hours in the light-emitting device of Example. In contrast, the initial emission intensity decreased to 86% of the initial emission intensity after heating for 200 hours in the light-emitting device of Comparison example.

What is claimed is:

1. A solid light-emitting device comprising a light-emitting semiconductor element and a phosphor dispersed in a sealant, said phosphor being excited by the light emitted by the semiconductor element to emit a visible light of a wavelength differing from that of the light emitted by the semiconductor element, in which the phosphor is a silicate phosphor or a phosphor having a hydroxyl group on a surface thereof, and in which the sealant is a condensation product of a prepolymer produced by condensation of polydimethylsiloxane having a silanol group at both ends and an oligomer of an alkoxide of a metal or a semimetal, a hydrolysis product of the oligomer, a condensation product of the hydrolysis products, or a condensation product of the oligomer and the hydrolysis product.

2. The solid light-emitting device of claim 1, in which the phosphor dispersed in a sealant is a silicate phosphor having a formula of $(Ba,Sr,Ca)_3MgSi_2O_8$ and being activated with Eu.

3. The solid light-emitting device of claim 1, in which the oligomer of an alkoxide of a metal or a semimetal is a linear oligomer derived from 4-10 tetraalkoxysilane.

4. The solid light-emitting device of claim 1, in which the polydimethylsiloxane has a number average molecular weight in the range of 10,000 to 100,000 and a ratio of Mw/Mn of 1.3 or less, wherein Mw means a weight average molecular weight and Mn means a number average molecular weight.

5. A prepolymer composition containing a phosphor dispersed therein, in which the phosphor is a silicate phosphor or a phosphor having a hydroxyl group on a surface thereof and in which the prepolymer is produced by condensation of polydimethylsiloxane having a silanol group at both ends and an oligomer of an alkoxide of a metal or a semi-metal, a hydrolysis product of the oligomer, a condensation product of the hydrolysis products, or a condensation product of the oligomer and the hydrolysis product.

6. The prepolymer composition of claim 5, in which the phosphor dispersed in a sealant is a silicate phosphor having a formula of $(Ba,Sr,Ca)_3MgSi_2O_8$ and being activated with Eu.

7. The prepolymer composition of claim 5, in which the oligomer of an alkoxide of a metal or a semimetal is a linear oligomer derived from 4-10 tetraalkoxysilane.

8. The prepolymer composition of claim 5, in which the polydimethylsiloxane has a number average molecular weight in the range of 10,000 to 100,000 and a ratio of Mw/Mn of 1.3 or less, wherein Mw means a weight average molecular weight and Mn means a number average molecular weight.

* * * * *